(12) United States Patent
Kitazume (10) Patent No.: US 12,232,269 B2
(45) Date of Patent: Feb. 18, 2025

(54) ELECTRONIC COMPONENT MODULE

(71) Applicant: Murata Manufacturing Co., Ltd., Nagaokakyo (JP)

(72) Inventor: Takahiro Kitazume, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 416 days.

(21) Appl. No.: 17/652,730

(22) Filed: Feb. 28, 2022

(65) Prior Publication Data

US 2022/0192026 A1 Jun. 16, 2022

Related U.S. Application Data

(63) Continuation of application No. PCT/JP2020/033360, filed on Sep. 3, 2020.

(30) Foreign Application Priority Data

Sep. 9, 2019 (JP) .................. 2019-163493

(51) Int. Cl.
*H05K 1/18* (2006.01)
*H01L 23/552* (2006.01)
*H01L 25/16* (2023.01)
*H01L 49/02* (2006.01)

(52) U.S. Cl.
CPC ............ *H05K 1/185* (2013.01); *H01L 28/10* (2013.01); *H05K 1/181* (2013.01); *H01L 23/552* (2013.01);
(Continued)

(58) Field of Classification Search
CPC ............ H05K 1/185; H05K 1/181; H05K 2201/1003; H05K 1/0216; H05K 3/284;
(Continued)

(56) References Cited

U.S. PATENT DOCUMENTS

2015/0351243 A1 12/2015 Toda et al.
2017/0083804 A1 3/2017 Kato et al.
(Continued)

FOREIGN PATENT DOCUMENTS

JP 2016-006847 A 1/2016
JP 5999295 B1 9/2016
(Continued)

OTHER PUBLICATIONS

International Search Report for International Patent Application No. PCT/JP2020/033360 dated Nov. 10, 2020.
(Continued)

*Primary Examiner* — Douglas W Owens
(74) *Attorney, Agent, or Firm* — McDonald Hopkins LLC (57) ABSTRACT

An electronic component module includes a substrate, an inductor element, a plurality of mounting type electronic components, and a shield film. The substrate has a first main surface and a second main surface, and the second main surface side is a side to be mounted on another circuit board. A first mounting type electronic component and a second mounting type electronic component are mounted on the first main surface. The shield film covers the first mounting type electronic component and the second mounting type electronic component and the first main surface side. The inductor element is disposed inside the substrate.

20 Claims, 9 Drawing Sheets (52) U.S. Cl.
CPC .... *H01L 25/165* (2013.01); *H05K 2201/1003* (2013.01)

(58) Field of Classification Search
CPC .. H05K 2201/0715; H05K 1/165; H05K 9/00; H01L 28/10; H01L 23/552; H01L 25/165; H01L 24/16; H01L 23/645; H01L 2223/6655; H01L 23/66; H01L 25/16; H01L 23/12; H01L 23/28; H01F 17/00
See application file for complete search history.

(56) References Cited

U.S. PATENT DOCUMENTS

| | | |
|---|---|---|
| 2018/0026606 A1 | 1/2018 | Takata |
| 2018/0114757 A1 | 4/2018 | Lee et al. |
| 2019/0237247 A1 | 8/2019 | Nanjyo et al. |
| 2019/0267339 A1* | 8/2019 | Murase .................. H01L 25/16 |
| 2021/0399084 A1* | 12/2021 | Kusuyama .......... H01F 17/0013 |

FOREIGN PATENT DOCUMENTS

| | | |
|---|---|---|
| WO | 2016/084658 A1 | 6/2016 |
| WO | 2018/088219 A1 | 5/2018 |
| WO | 2018/110513 A1 | 6/2018 |

OTHER PUBLICATIONS

Written Opinion for International Patent Application No. PCT/JP2020/033360 dated Nov. 10, 2020.

* cited by examiner

ELECTRONIC COMPONENT MODULE

CROSS REFERENCE TO RELATED APPLICATION

This is a continuation of International Application No. PCT/JP2020/033360 filed on Sep. 3, 2020 which claims priority from Japanese Patent Application No. 2019-163493 filed on Sep. 9, 2019. The contents of these applications are incorporated herein by reference in their entireties.

BACKGROUND OF THE DISCLOSURE

Field of the Disclosure

The present disclosure relates to an electronic component module including electronic components including an inductor and a substrate.

Description of the Related Art

Patent Literature 1 describes a package device including a substrate and electronic components. The electronic components are mounted on one main surface of the substrate. The electronic components are mounting type electronic components including active elements such as an IC and passive elements such as an inductor element, a capacitor element, or a resistive element.

The one main surface side of the substrate is molded with an insulating resin. A surface of the insulating resin and side surfaces of the substrate are covered with a conductive shield film. Another package material is further provided between the passive elements and the shield film above the passive elements to increase a distance between the passive elements and the shield film.

Patent Literature 1

U.S. Patent Application Publication No. 2018/0114757

BRIEF SUMMARY OF THE DISCLOSURE

In a case where an inductor element is provided as a passive element on the substrate and a distance between the inductor element and the shield film is short, the shield film is coupled to a magnetic field generated by the inductor element. This causes characteristic degradation of the inductor element. Therefore, in the configuration of Patent Literature 1, the distance between the passive element and the shield film is increased.

However, in a case where the distance between the inductor element and the shield film is increased, a distance from one main surface of the substrate to the shield film increases. This prevents a reduction in size of a package device (electronic component module).

Therefore, an object of the present disclosure is to provide a small-sized electronic component module that suppresses deterioration of characteristics of an inductor element.

An electronic component module of the present disclosure includes a substrate, a first electronic component, a shield film, and an inductor element. The substrate has a first main surface and a second main surface, and a second main surface side is a mounting side. The first electronic component is mounted on the first main surface. The shield film covers the first electronic component and a first main surface side. The inductor element is disposed inside the substrate.

According to this configuration, the inductor element is disposed inside the substrate, and therefore a distance between the inductor element and the shield film can be increased without increasing the size of the entire module. Therefore, coupling of a magnetic field generated by the inductor element with the shield film is suppressed.

According to this disclosure, it is possible to provide a small-sized electronic component module that suppresses characteristic deterioration of an inductor element.

DETAILED DESCRIPTION OF THE DISCLOSURE

First Embodiment

Figure 1A:
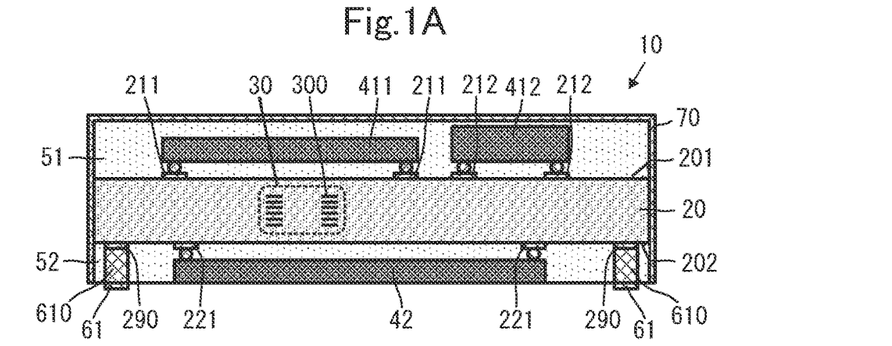
FIG. 1A is a side cross-sectional view illustrating a configuration of an electronic component module according to a first embodiment.
Figure 1B:
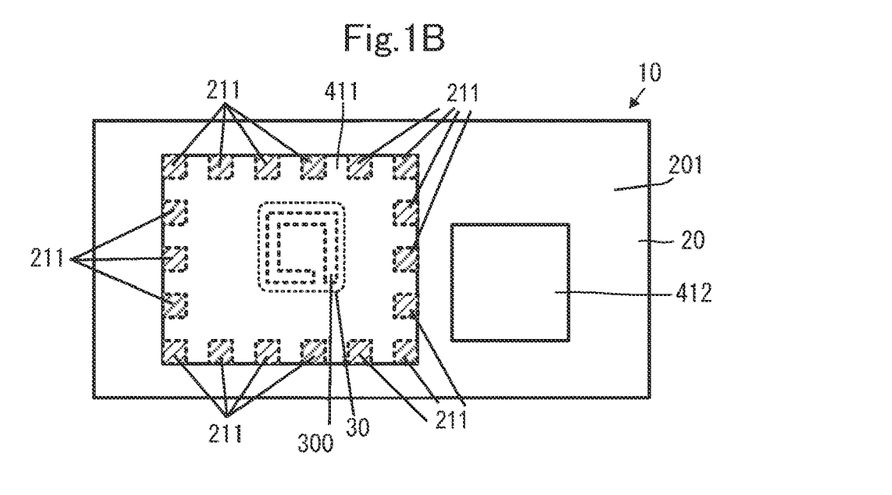
FIG. 1B is a first plan view illustrating the configuration of the electronic component module according to the first embodiment.
Figure 1C:
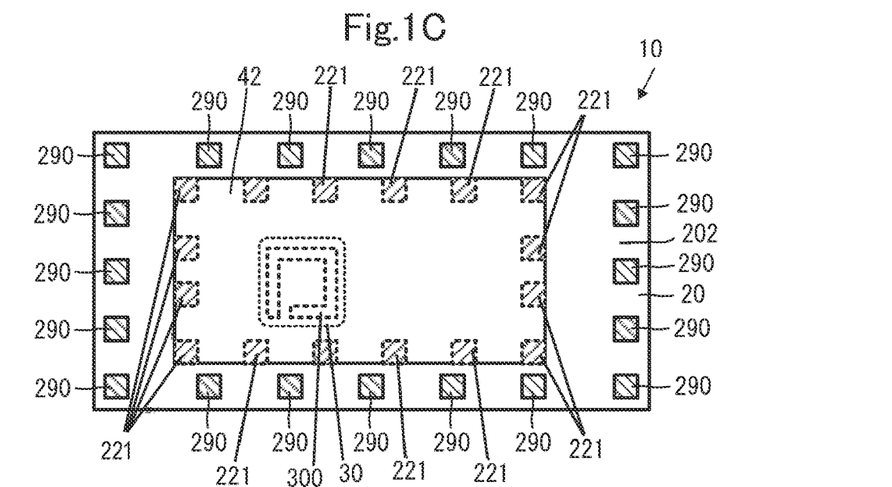
FIG. 1C is a second plan view illustrating the configuration of the electronic component module according to the first embodiment.

An electronic component module according to a first embodiment of the present disclosure will be described with reference to the drawings. FIG. 1A is a side cross-sectional view illustrating a configuration of an electronic component module according to the first embodiment. FIG. 1B is a first plan view illustrating a configuration of the electronic component module according to the first embodiment. FIG. 1C is a second plan view illustrating a configuration of the electronic component module according to the first embodiment. Note that, in FIGS. 1B and 1C, illustration of a shield film and an insulating resin is omitted. Furthermore, in FIG. 1C, illustration of a conductive post and a terminal conductor for external connection is omitted.

As illustrated in FIGS. 1A, 1B, and 1C, an electronic component module 10 includes a substrate 20, an inductor element 30, a mounting type electronic component 411, a mounting type electronic component 412, a mounting type electronic component 42, an insulating resin 51, an insulating resin 52, a plurality of terminal conductors 61, a plurality of conductive posts 610, and a shield film 70.

The substrate 20 has an insulating main body and includes a conductor pattern for realizing the electronic component module 10. The substrate 20 is configured such that a plurality of insulator layers having a predetermined conductor pattern are stacked. Note that illustration of the conductor pattern formed inside the substrate 20 is omitted except for the inductor element 30. The substrate 20 is a rectangular flat plate, and has a first main surface 201 and a second main surface 202 facing each other. The substrate 20 is a ceramic multilayer substrate. However, the substrate 20 may be a resin multilayer substrate.

Land conductors 211 and land conductors 212 are provided on first main surface 201 of substrate 20. The number of land conductors 211 corresponds to the number of terminals of the mounting type electronic component 411, and arrangement of the land conductors 211 corresponds to arrangement of the terminals of the mounting type electronic component 411. The number of land conductors 212 corresponds to the number of terminals of the mounting type electronic component 412, and arrangement of the land conductors 212 corresponds to arrangement of the terminals of the mounting type electronic component 412.

Land conductors 221 and terminal conductors for external connection 290 are provided on the second main surface 202 of substrate 20. The number of land conductors 221 corresponds to the number of terminals of the mounting type electronic component 42, and arrangement of the land conductors 221 corresponds to arrangement of the terminals of the mounting type electronic component 42. As illustrated in FIG. 1C, the terminal conductors for external connection 290 are arranged along an outer peripheral end in the vicinity of the outer peripheral end on the second main surface 202 of the substrate 20. The land conductors 221 are arranged in a region surrounded by the plurality of terminal conductors for external connection 290.

The inductor element 30 includes a plurality of inductor conductors 300. The plurality of inductor conductors 300 are disposed at intervals in a thickness direction of the substrate 20. The plurality of inductor conductors 300 is each a wound linear conductor, and are disposed so that central openings of the windings overlap when the substrate 20 is viewed in a direction orthogonal to the first main surface 201 and the second main surface 202.

The plurality of inductor conductors 300 are connected in order with an interlayer connection conductor or the like (not illustrated) interposed therebetween. As a result, the inductor element 30 is an element having a spiral conductor pattern. An axial direction of the spiral shape is parallel to the direction orthogonal to the first main surface 201 and the second main surface 202.

With this configuration, the inductor element 30 is disposed inside the substrate 20.

The mounting type electronic component 411, the mounting type electronic component 412, and the mounting type electronic component 42 are an IC using a semiconductor substrate, an SAW device or a BAW device using a piezoelectric body, or the like. The mounting type electronic component 411 and the mounting type electronic component 412 correspond to a "first electronic component" of the present disclosure. The mounting type electronic component 42 corresponds to a "second electronic component" of the present disclosure.

The mounting type electronic component 411 is bonded (mounted) to the land conductors 211 by using solder or the like. The mounting type electronic component 412 is bonded (mounted) to the land conductors 212 by using solder or the like. The mounting type electronic component 42 is bonded (mounted) to the land conductors 221 by using solder or the like.

The conductive posts 610 are, for example, columnar conductors. The conductive posts 610 are bonded (mounted) to the terminal conductors for external connection 290 by using solder or the like. As each of the conductive posts 610, a protruding electrode, a metal pin, plating, or the like is used. A solder bump may be used instead of the conductive post.

The insulating resin 51 covers the first main surface 201 side of the substrate 20. The insulating resin 51 also covers the mounting type electronic component 411 and the mounting type electronic component 412. Note that a thickness of the insulating resin 51 is preferably a minimum thickness that covers the mounting type electronic component 411 and the mounting type electronic component 412.

The insulating resin 52 covers the second main surface 202 side of the substrate 20. The insulating resin 52 covers the mounting type electronic component 42 and the conductive posts 610. However, a surface of the mounting type electronic component 42 opposite to a mount surface and surfaces of the conductive posts 610 opposite to surfaces bonded to the terminal conductors for external connection 290 are exposed from the insulating resin 52. The insulating resin 51 and the insulating resin 52 can protect the mounting type electronic component 411, the mounting type electronic component 412, the mounting type electronic component 42, and the conductor patterns formed on the first main surface 201 and the second main surface 202 of the substrate 20 from an external environment.

The terminal conductors 61 are provided on the surfaces of the conductive posts 610 opposite to the surfaces bonded to the terminal conductors for external connection 290.

The shield film 70 is a conductive film. The shield film 70 covers an entire outer surface of the insulating resin 51, entire side surfaces of the substrate 20, and entire side surfaces of the insulating resin 52. By thus disposing the shield film 70, it is possible to suppress unnecessary coupling and interference between the mounting type electronic component 411, the mounting type electronic component 412, the mounting type electronic component 42, and the electric configuration provided on the substrate 20 and the external environment.

With such a configuration, the electronic component module 10 forms, for example, at least a part of a front-end module for wireless communication of a high frequency signal. The inductor element 30 is used in an impedance matching circuit between circuit elements constituting the front-end module. For example, the inductor element 30 is used in an impedance matching circuit between a filter or a duplexer and a power amplifier (PA) and in an impedance matching circuit between a filter or a duplexer and a low noise amplifier (LNA).

Since the inductor element 30 is built in the substrate 20 as described above, a distance between the inductor element 30 and the shield film 70 can be increased as compared with an aspect in which the inductor element 30 is mounted on the first main surface 201 of the substrate 20. As a result, coupling between a magnetic field generated by the inductor element 30 and the shield film 70 is suppressed, and deterioration of characteristics of the inductor element 30 is suppressed.

Furthermore, since the inductor element 30 is built in the substrate 20, a distance between the inductor element 30 and another circuit board on which the electronic component module 10 is mounted can be increased as compared with an aspect in which the inductor element 30 is mounted on the second main surface 202 of the substrate 20. As a result, coupling between the magnetic field generated by the inductor element 30 and a conductor pattern of the other circuit board is suppressed, and deterioration of characteristics of the inductor element 30 is suppressed.

Furthermore, since the inductor element 30 is built in the substrate 20, a height of the electronic component module can be reduced as compared with an aspect in which the inductor element 30 is mounted on the first main surface 201 or the second main surface 202 of the substrate 20. That is, the electronic component module 10 can be reduced in size. In particular, as described above, an inductor used in an impedance matching circuit needs to have a relatively large shape because of required characteristics thereof. Therefore, in a case where the inductor element 30 is built in the substrate 20, it is possible to reduce the size more effectively.

According to the above configuration, the inductor element 30 is disposed in a region surrounded by the terminal conductors for external connection 290, as illustrated in FIG. 1C. As a result, a distance between the inductor element 30 and a side surface portion of the shield film 70 can also be increased. Therefore, it is also possible to suppress coupling of the magnetic field generated by the inductor element 30 with the side surface portion of the shield film 70 and to suppress characteristic deterioration of the inductor element 30.

According to the configuration of electronic component module 10 described above, the inductor element 30 overlaps the mounting type electronic component 411 and the mounting type electronic component 42 when the electronic component module 10 (the substrate 20) is viewed in a direction orthogonal to the first main surface 201 and the second main surface 202 of the substrate 20 (hereinafter referred to as a plan view in the present embodiment and other embodiments). In this configuration, the mounting type electronic component 411 and the mounting type electronic component 42 are electronic components mainly composed of a semiconductor or a piezoelectric body and are therefore flip-chip mounted. In this case, interference between the mounting type electronic component 411 and the mounting type electronic component 42 and the magnetic field generated by the inductor element 30 is kept small since the distance between the inductor element 30 and the mounting type electronic component 411 and the mounting type electronic component 42 can be increased. Therefore, even in a case where the inductor element 30 overlaps the mounting type electronic component 411 and the mounting type electronic component 42, deterioration of the characteristics of the inductor element 30 is suppressed.

Second Embodiment

Figure 2:
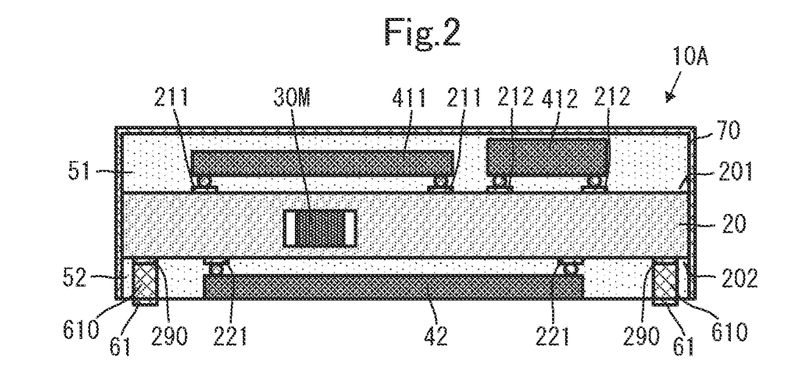
FIG. 2 is a side cross-sectional view illustrating a configuration of an electronic component module according to the second embodiment.

An electronic component module according to a second embodiment of the present disclosure will be described with reference to the drawings. FIG. 2 is a side cross-sectional view illustrating a configuration of an electronic component module according to the second embodiment.

As illustrated in FIG. 2, an electronic component module 10A according to the second embodiment is different from the electronic component module 10 according to the first embodiment in that an inductor element 30M is provided instead of the inductor element 30. Other configurations of the electronic component module 10A are similar to those of the electronic component module 10, and description of the similar parts will be omitted.

The electronic component module 10A includes the inductor element 30M. The inductor element 30M is a chip type electronic component. The inductor element 30M is mounted inside a substrate 20.

Even with such a configuration, the electronic component module 10A can suppress characteristic deterioration of the inductor element 30M and can be reduced in size, as in the case of the electronic component module 10.

Third Embodiment

Figure 3:
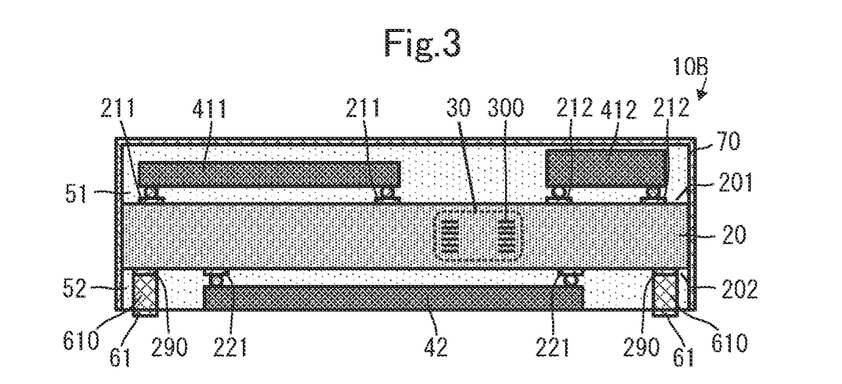
FIG. 3 is a side cross-sectional view illustrating a configuration of an electronic component module according to the third embodiment.

An electronic component module according to a third embodiment of the present disclosure will be described with reference to the drawings. FIG. 3 is a side cross-sectional view illustrating a configuration of an electronic component module according to the third embodiment.

As illustrated in FIG. 3, an electronic component module 10B according to the third embodiment is different from the electronic component module 10 according to the first embodiment in position of an inductor element 30. Other configurations of the electronic component module 10B are similar to those of the electronic component module 10, and description of the similar parts will be omitted.

In the electronic component module 10B, the inductor element 30 is disposed so as not to overlap a mounting type electronic component 411 in plan view.

Even with such a configuration, the electronic component module 10B can suppress characteristic deterioration of the inductor element 30 and can be reduced in size, as in the case of the electronic component module 10. In addition, with this configuration, even if the mounting type electronic component 411 is one that affects a magnetic field, influence of the mounting type electronic component 411 on a magnetic field of the inductor element 30 can be suppressed. Therefore, characteristic deterioration of the inductor element 30 is suppressed.

Fourth Embodiment

Figure 4:
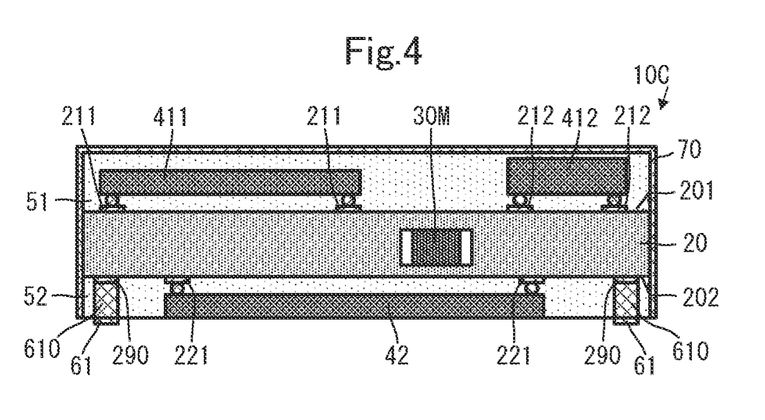
FIG. 4 is a side cross-sectional view illustrating a configuration of an electronic component module according to the fourth embodiment.

An electronic component module according to a fourth embodiment of the present disclosure will be described with reference to the drawings. FIG. 4 is a side cross-sectional view illustrating a configuration of an electronic component module according to the fourth embodiment.

As illustrated in FIG. 4, an electronic component module 10C according to the fourth embodiment is different from the electronic component module 10B according to the third embodiment in that an inductor element 30M is provided instead of the inductor element 30. Other configurations of the electronic component module 10C are similar to those of the electronic component module 10B, and description of the similar parts will be omitted.

The electronic component module 10C includes the inductor element 30M. The inductor element 30M is a chip type electronic component. The inductor element 30M is mounted inside a substrate 20. The inductor element 30M is disposed so as not to overlap a mounting type electronic component 411 in plan view.

Even with such a configuration, the electronic component module 10C can suppress characteristic deterioration of the inductor element 30M and can be reduced in size, as in the case of the electronic component module 10B.

Fifth Embodiment

Figure 5:
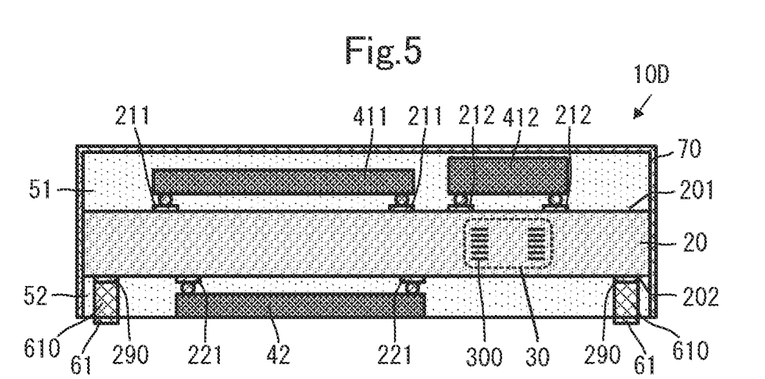
FIG. 5 is a side cross-sectional view illustrating a configuration of an electronic component module according to the fifth embodiment.

An electronic component module according to a fifth embodiment of the present disclosure will be described with reference to the drawings. FIG. 5 is a side cross-sectional view illustrating a configuration of an electronic component module according to the fifth embodiment.

As illustrated in FIG. 5, an electronic component module 10D according to the fifth embodiment is different from the electronic component module 10 according to the first embodiment in position of an inductor element 30. Other configurations of the electronic component module 10D are similar to those of the electronic component module 10, and description of the similar parts will be omitted.

In the electronic component module 10D, the inductor element 30 is disposed so as to overlap a mounting type electronic component 412 and so as not to overlap a mounting type electronic component 42 in plan view.

Even with such a configuration, the electronic component module 10D can suppress characteristic deterioration of the inductor element 30 and can be reduced in size, as in the case of the electronic component module 10. In addition, with this configuration, even if the mounting type electronic component 42 is one that affects a magnetic field, influence of the mounting type electronic component 42 on a magnetic field of the inductor element 30 can be suppressed. Therefore, characteristic deterioration of the inductor element 30 is suppressed.

Sixth Embodiment

Figure 6:
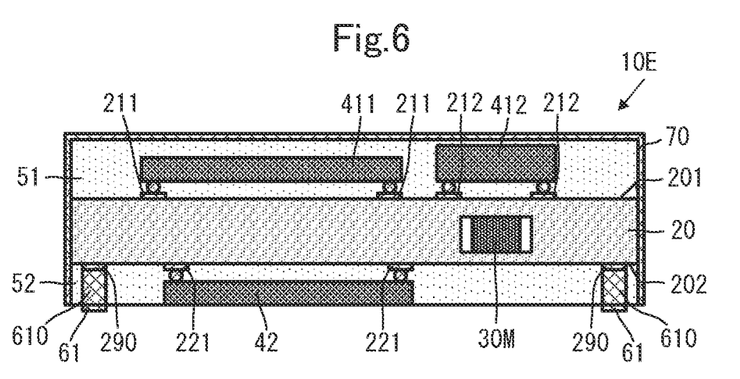
FIG. 6 is a side cross-sectional view illustrating a configuration of an electronic component module according to the sixth embodiment.

An electronic component module according to a sixth embodiment of the present disclosure will be described with reference to the drawings. FIG. 6 is a side cross-sectional view illustrating a configuration of an electronic component module according to the sixth embodiment.

As illustrated in FIG. 6, an electronic component module 10E according to the sixth embodiment is different from the electronic component module 10D according to the fifth embodiment in that an inductor element 30M is provided instead of the inductor element 30. Other configurations of the electronic component module 10E are similar to those of the electronic component module 10D, and description of the similar parts will be omitted.

The electronic component module 10E includes the inductor element 30M. The inductor element 30M is a chip type electronic component. The inductor element 30M is mounted inside a substrate 20. The inductor element 30M is disposed so as to overlap a mounting type electronic component 412 and so as not to overlap a mounting type electronic component 42 in plan view.

Even with such a configuration, the electronic component module 10E can suppress characteristic deterioration of the inductor element 30M and can be reduced in size, as in the case of the electronic component module 10D.

Seventh Embodiment

Figure 7:
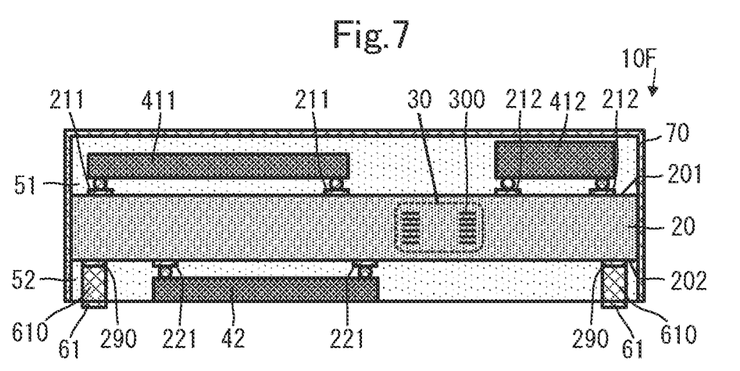
FIG. 7 is a side cross-sectional view illustrating a configuration of an electronic component module according to the seventh embodiment.

An electronic component module according to a seventh embodiment of the present disclosure will be described with reference to the drawings. FIG. 7 is a side cross-sectional view illustrating a configuration of an electronic component module according to the seventh embodiment.

As illustrated in FIG. 7, an electronic component module 10F according to the seventh embodiment is different from the electronic component module 10 according to the first embodiment in position of an inductor element 30. Other configurations of the electronic component module 10F are similar to those of the electronic component module 10, and description of the similar parts will be omitted.

In the electronic component module 10F, the inductor element 30 is disposed so as not to overlap a mounting type electronic component 411, a mounting type electronic component 412, and a mounting type electronic component 42 in plan view. That is, the inductor element 30 is disposed so as not to overlap all of the mounting type electronic components mounted on a substrate 20.

Even with such a configuration, the electronic component module 10F can suppress characteristic deterioration of the inductor element 30 and can be reduced in size, as in the case of the electronic component module 10. In addition, with this configuration, even if the mounting type electronic component 411, the mounting type electronic component 412, and the mounting type electronic component 42 are ones that affect a magnetic field, influence of the mounting type electronic component 411, the mounting type electronic component 412, and the mounting type electronic component 42 on a magnetic field of the inductor element 30 can be suppressed. Therefore, characteristic deterioration of the inductor element 30 is suppressed.

Eighth Embodiment

Figure 8:
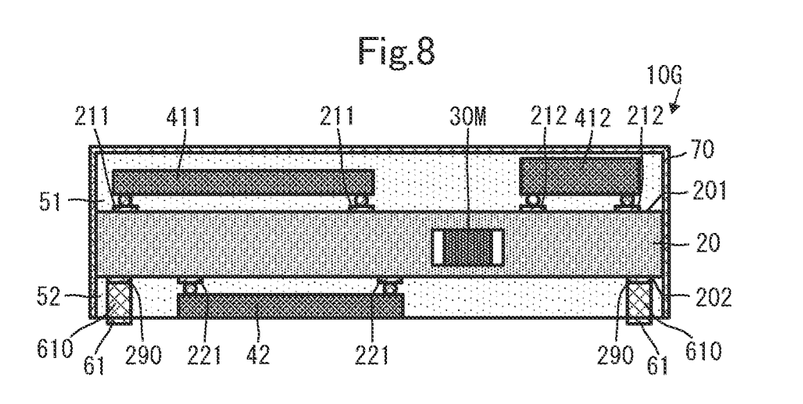
FIG. 8 is a side cross-sectional view illustrating a configuration of an electronic component module according to the eighth embodiment.

An electronic component module according to an eighth embodiment of the present disclosure will be described with reference to the drawings. FIG. 8 is a side cross-sectional view illustrating a configuration of an electronic component module according to the eighth embodiment.

As illustrated in FIG. 8, an electronic component module 10G according to the eighth embodiment is different from the electronic component module 10F according to the seventh embodiment in that an inductor element 30M is provided instead of the inductor element 30. Other configurations of the electronic component module 10G are similar to those of the electronic component module 10F, and description of the similar parts will be omitted.

The electronic component module 10G includes the inductor element 30M. The inductor element 30M is a chip type electronic component. The inductor element 30M is mounted inside a substrate 20. The inductor element 30M is disposed so as not to overlap a mounting type electronic component 411, a mounting type electronic component 412, and a mounting type electronic component 42 in plan view. That is, the inductor element 30M is disposed so as not to overlap all of the mounting type electronic components mounted on a substrate 20.

Even with such a configuration, the electronic component module 10G can suppress characteristic deterioration of the inductor element 30M and can be reduced in size, as in the case of the electronic component module 10F.

Ninth Embodiment

Figure 9:
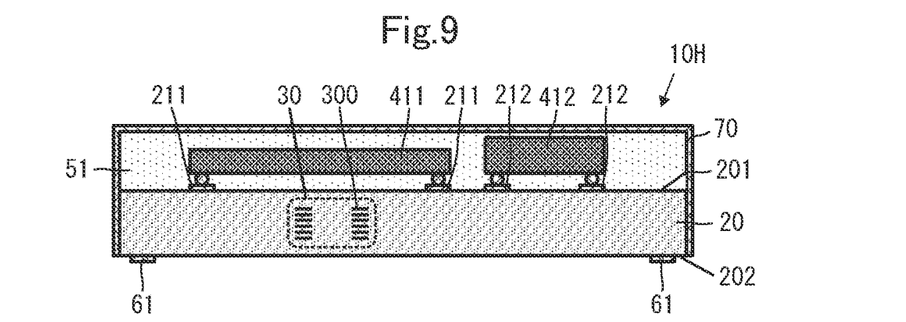
FIG. 9 is a side cross-sectional view illustrating a configuration of an electronic component module according to the ninth embodiment.

An electronic component module according to a ninth embodiment of the present disclosure will be described with reference to the drawings. FIG. 9 is a side cross-sectional view illustrating a configuration of an electronic component module according to the ninth embodiment.

As illustrated in FIG. 9, an electronic component module 10H according to the ninth embodiment is different from the electronic component module 10 according to the first embodiment in that mounting type electronic components are mounted only on a first main surface 201 side of a substrate 20 and no mounting type electronic component is mounted on a second main surface 202 side. Other configurations of the electronic component module 10H are similar to those of the electronic component module 10, and description of the similar parts will be omitted.

An inductor element 30 is formed in the substrate 20. A mounting type electronic component 411 and a mounting type electronic component 412 are mounted on the first main surface 201 of the substrate 20. When the substrate 20 is viewed in plan view, the inductor element 30 overlaps the mounting type electronic component 411.

On the second main surface 202 side of the substrate 20, terminal conductors 61 are provided, and no mounting type electronic component is mounted.

As described above, the electronic component module 10H has a configuration of a so-called single-sided mounting substrate. Even with such a configuration of the single-sided mounting substrate, similar effects to the electronic component module 10 can be produced since the inductor element 30 is built in the substrate 20, and the inductor element 30 and the mounting type electronic component 411 overlap each other in plan view.

Also in the present embodiment, the configuration of the second embodiment in which the inductor element 30M is provided, the configuration of the third and fourth embodiments in which the mounting type electronic component and the inductor element do not overlap in plan view, the configuration of the fifth and sixth embodiments in which the inductor element does not overlap one of a plurality of mounting type electronic components in plan view, the configuration of the seventh and eighth embodiments in which the inductor element does not overlap any of a plurality of mounting type electronic components in plan view, and the like can be applied.

It is preferable that a planar ground conductor provided on the substrate 20 does not overlap the inductor element 30 or the inductor element 30 M at all in plan view although this is not illustrated in the above embodiments. This makes it possible to further suppress deterioration in characteristics of the inductor element 30 and the inductor element 30 M.

Although a case where one inductor element is provided is illustrated in the above embodiments, in a case where a plurality of inductor elements are provided, the plurality of inductor elements are preferably disposed in the substrate 20. This makes it possible to reduce the size of the electronic component module while suppressing characteristic deterioration of all of the inductor elements. In this case, an inductor element having a relatively large shape is preferentially built in the substrate 20, like the above inductor element for an impedance matching circuit. That is, in a case where there is an inductor element that cannot be built in the substrate 20, a relatively large inductor element such as an inductor element for an impedance matching circuit may be built in, and a relatively small inductor element may be mounted on the first main surface 201 or the second main surface 202 of the substrate 20. However, in this case, it is preferable that the relatively small inductor element is mounted on the second main surface 202 of the substrate 20, and accordingly, it is preferable that the other circuit board on which the electronic component module is mounted does not have a planar conductor pattern in a portion facing the inductor element.

In addition, the configurations of the above embodiments can be appropriately combined, and effects according to the respective combinations can be produced.

10, 10A, 10B, 10C, 10D, 10E, 10F, 10G, 10H electronic component module
20 substrate
30, 30M inductor element
411, 412, 42 mounting type electronic component
51, 52 insulating resin
61 terminal conductor
70 shield film
201 first main surface
202 second main surface
211, 212, 221 land conductor
290 terminal conductor for external connection
300 inductor conductor
610 conductive post

The invention claimed is:

1. An electronic component module comprising:
a substrate having a first main surface and a second main surface, the second main surface being a mounting side;
a first electronic component mounted on the first main surface;
a conductive shield film covering the first electronic component and a side of the first main surface; and
an inductor element disposed inside the substrate, wherein:
the substrate includes a plurality of terminal conductors for connection arranged along an outer peripheral end of the second main surface;
the inductor element is disposed in a region surrounded by the plurality of terminal conductors when the substrate is viewed in a plan view;
the plurality of terminal conductors are outside an outer periphery of the inductor element when the substrate is viewed in the plan view; and
the inductor element is disposed between the first main surface and the second main surface in a thickness direction of the substrate.

2. The electronic component module according to claim 1, further comprising a second electronic component mounted on the second main surface.

3. The electronic component module according to claim 2, wherein the inductor element is disposed so as to overlap the first electronic component when the substrate is viewed in the plan view.

4. The electronic component module according to claim 2, wherein the inductor element is disposed so as to overlap the second electronic component when the substrate is viewed in the plan view.

5. The electronic component module according to claim 2, wherein the inductor element is disposed so as not to overlap the first electronic component and the second electronic component when the substrate is viewed in the plan view.

6. The electronic component module according to claim 1, wherein the inductor element is a wound linear conductor provided inside the substrate.

7. The electronic component module according to claim 1, wherein the inductor element is a chip type electronic component mounted inside the substrate.

8. The electronic component module according to claim 1, further comprising an insulating resin covering the first electronic component.

9. The electronic component module according to claim 3, wherein the inductor element is disposed so as to overlap the second electronic component when the substrate is viewed in the plan view.

10. The electronic component module according to claim 2, wherein the inductor element is a wound linear conductor provided inside the substrate.

11. The electronic component module according to claim 3, wherein the inductor element is a wound linear conductor provided inside the substrate.

12. The electronic component module according to claim 4, wherein the inductor element is a wound linear conductor provided inside the substrate.

13. The electronic component module according to claim 5, wherein the inductor element is a wound linear conductor provided inside the substrate.

14. The electronic component module according to claim 2, wherein the inductor element is a chip type electronic component mounted inside the substrate.

15. The electronic component module according to claim 3, wherein the inductor element is a chip type electronic component mounted inside the substrate.

16. The electronic component module according to claim 4, wherein the inductor element is a chip type electronic component mounted inside the substrate.

17. The electronic component module according to claim 5, wherein the inductor element is a chip type electronic component mounted inside the substrate.

18. The electronic component module according to claim 2, further comprising an insulating resin covering the first electronic component.

19. The electronic component module according to claim 3, further comprising an insulating resin covering the first electronic component.

20. The electronic component module according to claim 4, further comprising an insulating resin covering the first electronic component.

* * * * *